(12) United States Patent
Kanoh et al.

(10) Patent No.: US 8,072,206 B2
(45) Date of Patent: Dec. 6, 2011

(54) SPECTRUM ANALYZER SYSTEM AND SPECTRUM ANALYZE METHOD

(75) Inventors: Eiji Kanoh, Miyagi (JP); Makoto Nakanishi, Miyagi (JP); Tatsuru Orikasa, Miyagi (JP); Tomoo Yamanouchi, Miyagi (JP)

(73) Assignee: Advantest Corporation, Tokyo (JP)

( * ) Notice: Subject to any disclaimer, the term of this patent is extended or adjusted under 35 U.S.C. 154(b) by 479 days.

(21) Appl. No.: 12/326,907

(22) Filed: Dec. 3, 2008

(65) Prior Publication Data
US 2009/0302829 A1 Dec. 10, 2009

Related U.S. Application Data

(63) Continuation of application No. PCT/JP2007/066020, filed on Aug. 17, 2007.

(30) Foreign Application Priority Data

Aug. 24, 2006 (JP) .................................. 2006-227701

(51) Int. Cl.
*G01R 23/00* (2006.01)

(52) U.S. Cl. .................................................... 324/76.19

(58) Field of Classification Search ................ 324/76.19
See application file for complete search history.

(56) References Cited

U.S. PATENT DOCUMENTS

| 5,162,723 | A | * | 11/1992 | Marzalek et al. | .......... 324/76.19 |
|---|---|---|---|---|---|
| 5,706,202 | A | * | 1/1998 | Itahara et al. | .................. 702/77 |
| 6,335,615 | B1 | * | 1/2002 | Gorin | .......................... 324/76.39 |
| 6,597,161 | B2 | * | 7/2003 | Jin et al. | ..................... 324/76.21 |
| 2006/0109915 | A1 | * | 5/2006 | Unger | ...................... 375/240.27 |
| 2006/0215788 | A1 | * | 9/2006 | Nara | ............................. 375/324 |

FOREIGN PATENT DOCUMENTS

| JP | 63-317781 | 12/1988 |
|---|---|---|
| JP | 1-105181 A | 4/1989 |
| JP | 2-47563 A | 2/1990 |
| JP | 5-14937 | 2/1993 |
| JP | 9-257843 | 10/1997 |
| JP | 2001-249149 A | 9/2001 |
| JP | 2001-272425 | 10/2001 |

* cited by examiner

*Primary Examiner* — Jeff Natalini
(74) *Attorney, Agent, or Firm* — Jianq Chyun IP Office

(57) ABSTRACT

Provided is a spectrum analysis system that measures a signal component at each frequency of an input signal, comprising a sampling section that samples the input signal at prescribed bandwidths to digitize the input signal, and outputs a resulting digital output signal; a converting section that converts the digital output signal from the sampling section into the signal component at each frequency of a unit bandwidth; and an output section that (i) outputs the digital output signal output by the sampling section when a frequency span, which is a frequency range in which the measurement result of the signal component at each frequency of the input signal is output, is greater than or equal to a predetermined reference bandwidth and (ii) outputs the signal component at each frequency converted by the converting section when the frequency span is less than the predetermined reference bandwidth.

12 Claims, 4 Drawing Sheets

SPECTRUM ANALYZER SYSTEM AND SPECTRUM ANALYZE METHOD

CROSS REFERENCE TO RELATED APPLICATION

This is a continuation application of PCT/JP2007/66020 filed on Aug. 17, 2007, which claims priority from a Japanese Patent Application NO. 2006-227701 filed on Aug. 24, 2006, the contents of which are incorporated herein by reference.

BACKGROUND

1. Technical Field

The present invention relates to a spectrum analysis system and a spectrum analysis method. In particular, the present invention relates to a spectrum analysis system and a spectrum analysis method for measuring a signal component at each frequency of an input signal.

2. Related Art

A spectrum analyzer is a known apparatus for analyzing frequency of a signal, as shown in, for example, Japanese Patent Application Publication No. 2001-272425. This spectrum analyzer generates an IF signal by multiplying an input signal to be measured and a local signal having a frequency that sequentially changes, and passes a prescribed band component of the IF signal through a band pass filter. The spectrum analyzer then AD converts the signal component passed through the band pass filter, and displays the result in a frequency spectrum as a signal component at each frequency determined according to the frequency of the local signal. The frequency resolution of this spectrum analyzer is determined by the pass-band of the band pass filter immediately before the AD converter.

In order to realize a narrower resolution bandwidth, that is, in order to display the frequency component of the input signal with a resolution bandwidth narrower than the pass-band of the band pass filter immediately before the AD converter, the spectrum analyzer uses a digital filter to filter the digital signal after AD conversion, as shown in, for example, Japanese Patent Application Publication No. 9-257843, or performs an FFT on the AD converted digital signal.

When using a digital filter to analyze the frequency with a narrower resolution bandwidth, however, the spectrum analyzer must change the local signal at frequency widths less than or equal to the resolution bandwidth, e.g. frequency widths less than or equal to half of a half-value width of the digital filter.

Furthermore, when analyzing the frequency of the signal over a wide frequency span, the spectrum analyzer samples high-order harmonics of the IF signal obtained by multiplying the local signal by the input signal, and performs data processing on these sampled signals. In this case, the frequency change of the sampled high-order harmonic signal of the IF signal is several orders greater than the frequency change of the local signal. For example, if a $6^{th}$ order harmonic signal of the IF signal is sampled and processed, the frequency change of this $6^{th}$ order harmonic signal is 6 times the frequency change of the local signal. In other words, the spectrum analyzer must change the frequency of the local signal at frequency widths that are less than or equal to $\frac{1}{12}$ of the resolution bandwidth.

If the local signal changes within a range of 4 to 8 GHz and the $6^{th}$ order harmonic signal is sampled and processed, the spectrum analyzer can analyze the frequency of the input signal over a wide frequency range of 48 GHz. If the resolution bandwidth is set to 1 kHz, however, the spectrum analyzer must change the frequency of the local signal at frequency widths of $\frac{1}{12}$ kHz over the range from 4 to 8 GHz. In other words, the spectrum analyzer must be provided with a local signal oscillator that can change the local signal with a resolution less than or equal to 100 Hz over the range of 4 to 8 GHz. A local signal oscillator capable of such a wide range and high resolution has a large circuit size.

On the other hand, if an FFT is used to analyze the frequency with a narrower resolution bandwidth, the spectrum analyzer can achieve a high resolution bandwidth without changing the frequency of the local signal at small frequency units. However, the spectrum analyzer can output only the signal component within the pass-band of the band pass filter immediately before the AD converter with a single FFT. Accordingly, when analyzing the frequency of the signal over a wide frequency span, the spectrum analyzer must perform a plurality of FFTs at units equal to the pass-band of the band pass filter. For example, when using FFTs to analyze the frequency of a 40 GHz span from 5 to 45 GHz, if the pass-band of the band pass filter is 10 MHz, the spectrum analyzer must perform the FFT 4000 times (40 GHz/10 MHz). Therefore, the spectrum analyzer that uses FFTs to analyze the frequency with a narrower resolution bandwidth requires an extremely long time to analyze the frequency over a wide frequency span.

SUMMARY

Therefore, it is an object of an aspect of the innovations herein to provide a spectrum analysis system and a spectrum analysis method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary spectrum analysis system may include a spectrum analysis system that measures a signal component at each frequency of an input signal, comprising a sampling section that samples the input signal at prescribed bandwidths to digitize the input signal, and outputs a resulting digital output signal; a converting section that converts the digital output signal from the sampling section into the signal component at each frequency of a unit bandwidth; and an output section that (i) outputs the digital output signal output by the sampling section when a frequency span, which is a frequency range in which the measurement result of the signal component at each frequency of the input signal is output, is greater than or equal to a predetermined reference bandwidth and (ii) outputs the signal component at each frequency converted by the converting section when the frequency span is less than the predetermined reference bandwidth.

According to a second aspect related to the innovations herein, one exemplary spectrum analysis system may include a spectrum analysis system that measures a signal component at each frequency of an input signal, comprising a sampling section that samples the input signal at prescribed bandwidths to digitize the input signal, and outputs a resulting digital output signal; and an averaging section that averages the digital output signal output by the sampling section, when a frequency span, which is a frequency range in which the measurement result of the signal component at each frequency of the input signal is output, is greater than or equal to a predetermined reference bandwidth.

According to a third aspect related to the innovations herein, one exemplary spectrum analysis method may include a spectrum analysis method for measuring a signal component at each frequency of an input signal, comprising sampling the input signal at prescribed bandwidths to digitize the input signal, and outputting a resulting digital output signal; converting the digital output signal into the signal component at each frequency of a unit bandwidth narrower than the reference bandwidth; outputting (i) the digital output signal output when the frequency span is greater than or equal to the reference bandwidth and (ii) the signal component at each frequency converted during the converting when the frequency span is less than the predetermined reference bandwidth.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
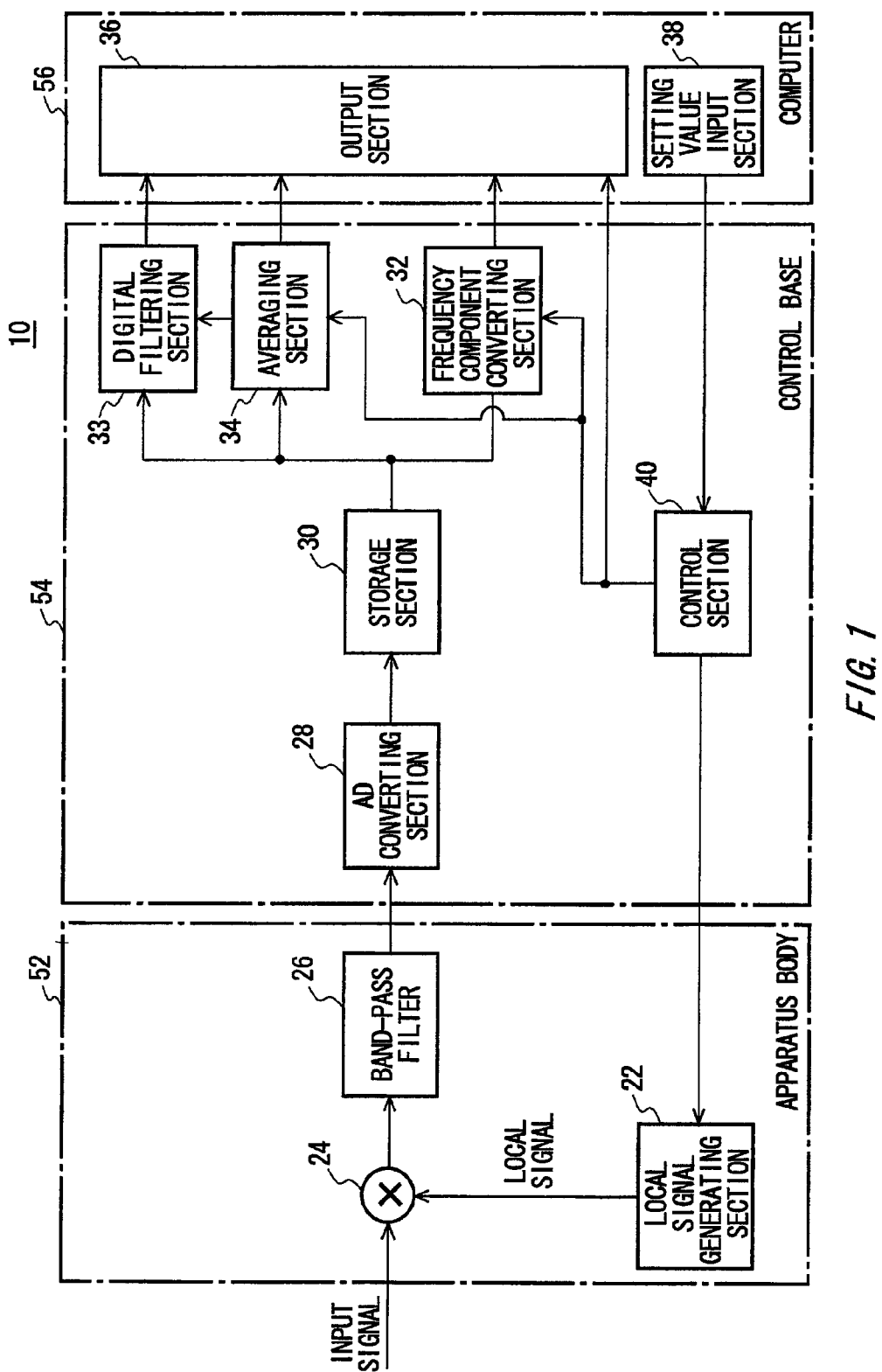
FIG. 1 shows a configuration of a spectrum analysis system 10 according to an embodiment of the present invention.

FIG. 1 shows a configuration of a spectrum analysis system 10 according to an embodiment of the present invention. The spectrum analysis system 10 measures a signal component for each frequency of an input signal serving as the measurement target. The spectrum analysis system 10 is provided with a local signal generating section 22, a multiplying section 24, a band pass filter 26, an AD converting section 28, a storage section 30, a frequency component converting section 32, a digital filtering section 33, an averaging section 34, an output section 36, a setting value input section 38, and a control section 40.

The local signal generating section 22 generates a local signal having a frequency that sequentially changes. The local signal generating section 22 may change the frequency of the local signal at prescribed frequency intervals within a range designated by the frequency range being measured.

The multiplying section 24 outputs a composite signal obtained by multiplying (i) the input signal, which is the measurement target, by (ii) the local signal output by the local signal generating section 22. In other words, the multiplying section 24 outputs a composite signal obtained by frequency shifting the input signal by the frequency of the local signal. The band pass filter 26 receives the composite signal output by the multiplying section 24 and allows a prescribed frequency band of the composite signal to pass through. In other words, the band pass filter 26 outputs the component of the input signal included within the designated frequency band in the pass band of the band pass filter 26 and the frequency of the local signal.

The AD converting section 28 is an example of a sampling section in the present invention, and samples the signal passed by the band pass filter 26 to output a digital output signal. The storage section 30 stores the digital output signal from the AD converting section 28. The storage section 30 may store the digital output signal, which is obtained through the sampling by the AD converting section 28, in association with the frequency of the input signal corresponding to the frequency of the local signal at the time of the sampling.

The frequency component converting section 32 is an example of a converting section in the present invention. If a frequency span, which is the frequency range in which the measurement result of the signal component for each frequency of the input signal is output, is less than a preset reference bandwidth, the frequency component converting section 32 converts the digital output signal from the AD converting section 28 into a signal component at each frequency of a unit bandwidth narrower than the reference bandwidth. For example, if the signal component within a range from 5 GHz to 45 GHz in the input signal is measured at every 100 kHz, the frequency span is 40 GHz (45-5 GHz) and the unit bandwidth is 100 kHz. In other words, the unit bandwidth becomes a resolution bandwidth in the frequency direction indicating a frequency analysis result. The reference bandwidth may be substantially equal to the pass bandwidth of the band pass filter 26.

The frequency component converting section 32 may convert the digital output signal from the AD converting section 28 into a signal component at each frequency of the unit bandwidth narrower than the reference bandwidth by performing a Fourier transform, e.g. an FFT, on the digital output signal. As another example, the frequency component converting section 32 may convert the digital output signal sampled over prescribed durations while the frequency of the local signal is held constant, into a signal component at each frequency of the unit bandwidth narrower than the reference bandwidth. If the reference bandwidth is greater than the bandwidth of the band pass filter 26 and the frequency span is greater than the bandwidth of the band pass filter 26 but less than the reference bandwidth, the frequency component converting section 32 may change the frequency of the local signal at units equal to the pass band of the band pass filter 26 and perform the Fourier transform several times across the entire frequency span. In this way, the frequency component converting section 32 can convert the signal components in the input signal included in the band determined according to the pass band of the band pass filter 26 and centered on the frequency determined according to the frequency of the local signal, into a signal component at each frequency of a unit bandwidth smaller than the pass band of the band pass filter 26. If the resolution bandwidth, i.e. the unit bandwidth, of the frequency component converting section 32 is less than a preset bandwidth, for example, the frequency component converting section 32 may convert the digital output signal stored in the storage section 30 into a signal component at each frequency that is less than or equal to the reference bandwidth.

If the frequency span is greater than or equal to the reference bandwidth, the digital filtering section 33 passes the signal components within the preset frequency band in the digital output signal from the AD converting section 28. The pass bandwidth of the digital filtering section 33 is less than the pass band of the band pass filter 26. In this way, the digital filtering section 33 can output the signal components in the input signal included at the units determined according to the pass band of the digital filtering section 33 and centered on the frequency determined according to the frequency of the local signal. If the digital signal passed by the digital filtering section 33 is output as the measurement result, the unit bandwidth, i.e. the resolution bandwidth, is determined according to the pass bandwidth of the digital filtering section 33.

If the frequency span is greater than or equal to the reference bandwidth, the averaging section 34 averages the digital output signal from the AD converting section 28. For example, the averaging section 34 averages, over time, the digital output signal sampled over a prescribed interval while the frequency of the local signal is held constant. The frequency component converting section 32 can average the signal component in the input signal included in the band determined according to the pass band of the band pass filter 26 and centered on the frequency determined according to the constant frequency of the local signal. The averaging section 34 may be a digital filter with a prescribed number of taps.

If the frequency span is greater than or equal to the reference bandwidth, the output section 36 outputs the digital output signal passed through the digital filtering section 33 as the signal component at the frequency in the input signal determined according to the frequency of the local signal. If the frequency span is greater than or equal to the reference bandwidth, the output section 36 may instead read the digital output signal output by the AD converting section 28 from the storage section 30, and output the read digital output signal as the signal component at the frequency in the input signal determined according to the frequency of the local signal. As yet another example, if the frequency span is greater than or equal to the reference bandwidth, the output section 36 may instead output the digital output signal averaged by the averaging section 34 as the signal component at the frequency in the input signal determined according to the frequency of the local signal. In this case, the output section 36 may plot the digital output signal on a grid in which the x-axis represents frequency and the y-axis represents the signal level.

If the frequency span is less than the reference bandwidth, the output section 36 outputs the signal component at each frequency converted by the frequency component converting section 32, as the signal component of the input signal at each frequency within the bandwidth determined according to the frequency of the local signal. In this case, the output section 36 may plot the signal component at the frequency converted by the frequency component converting section 32 on a grid in which the x-axis represents frequency and the y-axis represents the signal level.

The setting value input section 38 inputs setting values to be set in each section. For example, the setting value input section 38 inputs (i) a measured frequency range that indicates the frequency range in which the signal component is measured at each frequency of the input signal, e.g. a frequency span, (ii) a unit bandwidth for outputting a measurement result of the signal component at each frequency of the input signal, e.g. a resolution in the frequency direction, (iii) a start frequency that is the lowest frequency in the frequency range at which the signal component is measured at each frequency of the input signal, and (iv) an end frequency that is the highest frequency at which the signal component is measured at each frequency of the input signal.

The control section 40 performs overall control of the spectrum analysis system 10. For example, the control section 40 sequentially changes the frequency of the local signal output by the local signal generating section 22, according to the setting values such as the unit bandwidth, the start frequency, and the end frequency, i.e. the frequency span. In other words, the control section 40 may control the lowest frequency, the highest frequency, and the interval at which the frequency changes in the local signal output by the local signal generating section 22, such that the signal component passed by the band pass filter 26 includes a signal component of the input signal reflecting the setting values set to the setting value input section 38. If the frequency span is greater than or equal to the reference bandwidth, the control section 40 changes the frequency of the local signal according to the frequency width corresponding to the unit bandwidth, i.e. the resolution bandwidth. If the frequency span is less than the reference bandwidth, the control section 40 changes the frequency of the local signal according to the frequency width corresponding to the pass bandwidth of the band pass filter 26. Furthermore, the control section 40 may judge whether the set frequency span is less than a predetermined reference bandwidth, e.g. the pass bandwidth of the band pass filter 26, and notify the frequency component converting section 32, the digital filtering section 33, the averaging section 34, and the output section 36 concerning the judgment result.

The spectrum analysis system 10 having the configuration described above changes the local signal according to a frequency width corresponding to the unit bandwidth when the frequency span is greater than or equal to the reference bandwidth, and outputs a digital output signal passed by the digital filtering section 33, or a digital output signal from the averaging section 34 or the band pass filter 26, as a measurement result. On the other hand, when the frequency span is less than the reference bandwidth, the spectrum analysis system 10 changes the local signal according to a frequency width corresponding to the pass bandwidth of the band pass filter 26, and outputs a signal component at each frequency output by the frequency component converting section 32 as a measurement result. In this way, the spectrum analysis system 10 allows the local signal generating section 22 to have a simple configuration and enables the measurement process to be completed quickly by decreasing the number of FFTs or the like performed by the frequency component converting section 32.

If the frequency component converting section 32 performs FFTs on a frequency range of 10 MHz, for example, the local signal generating section 22 may change the frequency of the local signal at 10 MHz intervals. Instead, if the local signal generating section 22 can generate a local signal of 4 to 8 GHz and the AD converting section 28 can sample up to a $6^{th}$ order harmonic signal of the composite signal output from the multiplying section 24, the local signal generating section 22 may change the frequency of the local signal at intervals of (10/6) MHz.

If the reference bandwidth is 100 MHz, the output section 36 can output a digital output signal passed by the digital filtering section 33 without the frequency component converting section 32 performing the FFT, as long as the frequency span is greater than or equal to 100 MHz. In this case, if the bandwidth passed by the digital filtering section 33, i.e. the resolution bandwidth, can be set to a minimum of 100 kHz, the local signal generating section 22 may change the frequency of the local signal at intervals of 100 kHz. Instead, if the local signal generating section 22 can generate a local signal of 4 to 8 GHz and the AD converting section 28 can sample up to the $6^{th}$ order harmonic signal of the composite signal output from the multiplying section 24, the local signal generating section 22 may change the frequency of the local signal at intervals of approximately 8.3 kHz (100 kHz/12).

The spectrum analysis system 10 having the above configuration may be provided with an apparatus body 52, a control base 54, and a computer 56. The apparatus body 52 functions as the body of the spectrum analysis system 10, and is provided with a signal input terminal, an operating section, and the like. The apparatus body 52 includes therein the local signal generating section 22, the multiplying section 24, and the band pass filter 26.

The control base 54 is provided with the AD converting section 28, the storage section 30, the frequency component converting section 32, the digital filtering section 33, the averaging section 34, and the control section 40, and is connected to the apparatus body 52 to function integrally therewith. The computer 56 is connected to the control base 54 via an interface such as a USB (Universal Serial Bus). The computer 56 is installed with programs that causes the computer 56 to function as the output section 36 and the setting value input section 38, and these programs are executed when the computer 56 functions as a portion of the spectrum analysis system 10. Instead of being provided in the control base 54, the frequency component converting section 32 may be realized as a function of the computer 56.

Figure 2:
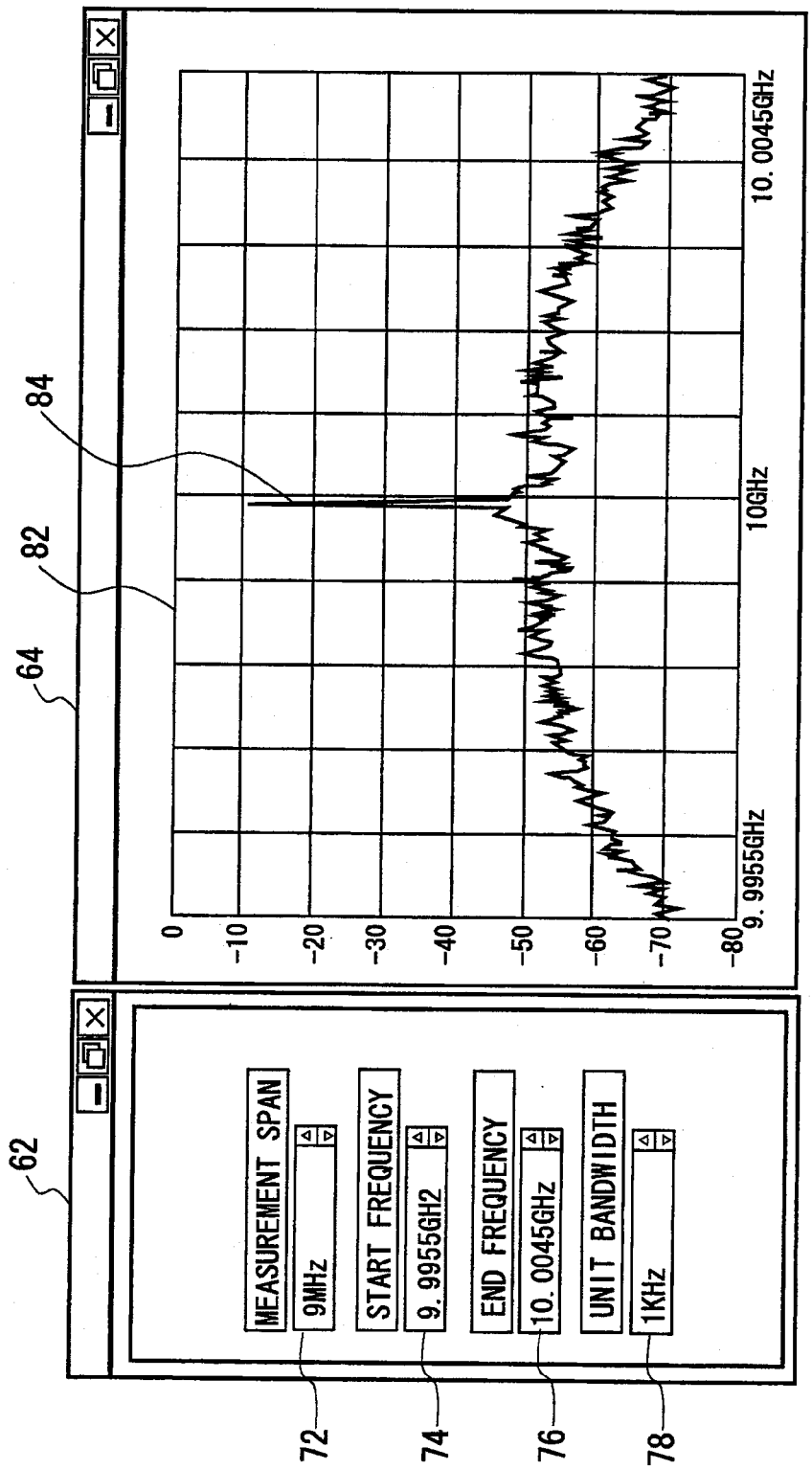
FIG. 2 shows examples of a setting value input screen 62 and a measurement result output screen 64.

FIG. 2 shows examples of a setting value input screen 62 and a measurement result output screen 64. The setting value input section 38 may display the setting value input screen 62 on a monitor of the computer 56, and a user may input setting values via the setting value input screen 62. For example, the setting value input section 38 may display on the setting value input screen 62 a frequency span input box 72 by which the user inputs the setting for the frequency span, a start frequency input box 74 by which the user inputs the setting for the start frequency, an end frequency input box 76 by which the user inputs the setting for the end frequency, and a unit bandwidth input box 78 by which the user inputs the setting for the unit bandwidth. The setting value input section 38 may receive the setting values via these boxes.

The output section 36 may display the measurement result output screen 64 on the monitor of the computer 56, and may output the measurement results to the user via the measurement result output screen 64. For example, the output section 36 may display the measurement result output screen 64 in which is plotted a graph 84 indicating the measurement results on a grid 82 with the X-axis representing frequency and the Y-axis representing the signal level.

In this case, if the frequency span is greater than or equal to the reference bandwidth, the output section 36 may plot the signal level of the digital output signal passed by the digital filtering section 33 on the grid 82 at a frequency position corresponding to the frequency of the local signal at the sampling time of the digital output signal. Instead of the signal level of the digital output signal, the output section 36 may plot the signal level of a corresponding digital output signal or the signal level of a digital output signal averaged by the averaging section 34. If the frequency span is less than the reference bandwidth, the output section 36 may plot the signal level of the signal component at of the input signal at each frequency read from the frequency component converting section 32 on the grid 82 at frequency positions within the band determined according to the frequency of the local signal.

Figure 3:
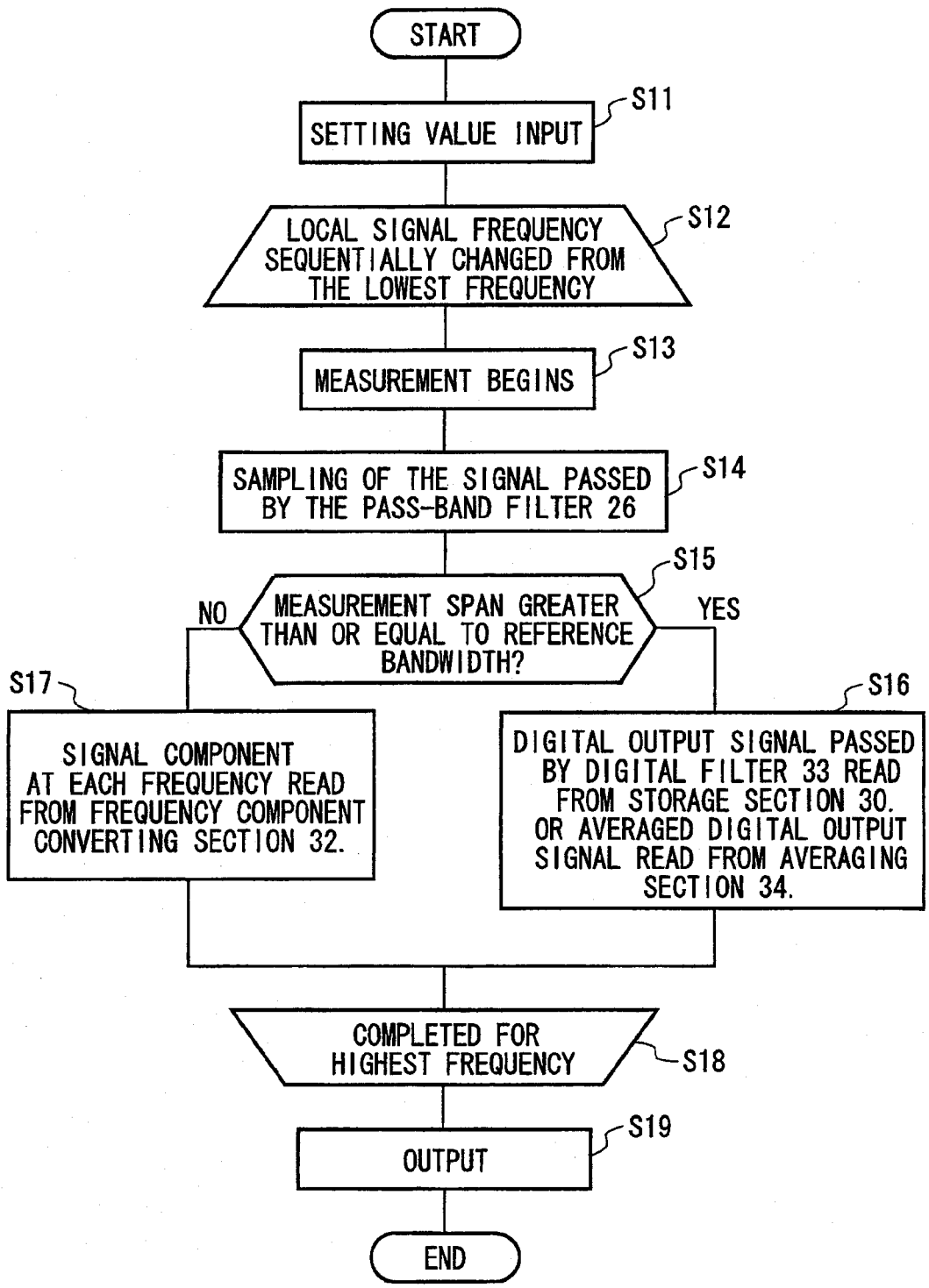
FIG. 3 shows an exemplary process flow performed by the spectrum analysis system 10.

FIG. 3 shows an exemplary process flow performed by the spectrum analysis system 10. First, the setting value input section 38 inputs the setting values such as the frequency span, the unit bandwidth, the start frequency, and the end frequency to the control section 40 (S11). The control section 40 calculates the lowest frequency, the highest frequency, and the frequency change interval for the local signal output by the local signal generating section 22, based on the received setting values. The control section 40 then sequentially changes the frequency of the local signal at the frequency change intervals, from the lowest frequency to the highest frequency, and performs the measurement process from step S13 to step S17 at each frequency of the local signal (S12, S18).

At step S13, the local signal generating section 22 outputs the local signal having a frequency set by the control section 40, the multiplying section 24 outputs a combined signal obtained by multiplying the input signal by the local signal having the set frequency, and the band pass filter 26 passes the signal component in a prescribed bandwidth of the combined signal. Next, at step 14, the AD converting section 28 samples the signal passed by the band pass filter 26 for a prescribed period to digitize the signal, and the storage section 30 sequentially stores the digital output signal from the AD converting section 28.

As a result of step S14, the storage section 30 can store, for a prescribed amount of sampling time, the signal component of the input signal included in the band determined according to the pass band of the band pass filter 26, which is centered on the frequency determined according to the frequency of the local signal. At step S14, the AD converting section 28 may set (i) the sampling period of a combined signal with the same frequency as the local signal when the frequency span is less than the reference bandwidth to be longer than (ii) the sampling period of a combined signal with the same frequency as the local signal when the frequency span is greater than or equal to the reference bandwidth. In this way, the AD converting section 28 can output an accurate signal component, even if the signal component within the pass-band of the band pass filter 26 is converted into the signal component at each frequency at a finer resolution.

Next, the control section 40 judges whether or not the frequency span is greater than or equal to the reference bandwidth, e.g. the pass bandwidth of the band pass filter 26 (S15). If the control section 40 judges that the frequency span is greater than or equal to the reference bandwidth (the "YES" of S15), the output section 36 reads the digital output signal passed by the digital filtering section 33 from the storage section 30, reads the digital output signal output by the AD converting section 28 from the storage section 30, or reads the averaged digital output signal from the averaging section 34, as the signal component of the input signal with the frequency determined according to the frequency of the local signal (S16).

If the control section 40 judges that the frequency span is less than the reference bandwidth (the "NO" of S15), the frequency component converting section 32 performs an FFT or the like on the digital output signal from the AD converting section 28 to convert the digital output signal into a signal component at each frequency of a bandwidth, e.g. the unit bandwidth, narrower than the reference bandwidth. The output section 36 reads the signal component of the input signal at each frequency from the frequency component converting section 32 as the signal component at each frequency within the band determined according to the frequency of the local signal (S17).

After the processes from S12 to S18 are completed up to the highest frequency (S18), the output section 36 outputs the measurement result (S19). For example, the output section 36 displays the frequency spectrum on a monitor. After such a display, the output section 36 may return to the process of step S12. In this way, the output section 36 can measure the signal component at each frequency of the input signal in a time sequence.

By performing the processes of steps S11 to S19, the spectrum analysis system 10 can use a simple configuration to quickly analyze the frequency of an input signal over a wide frequency span and with a narrow resolution bandwidth.

Figure 4:
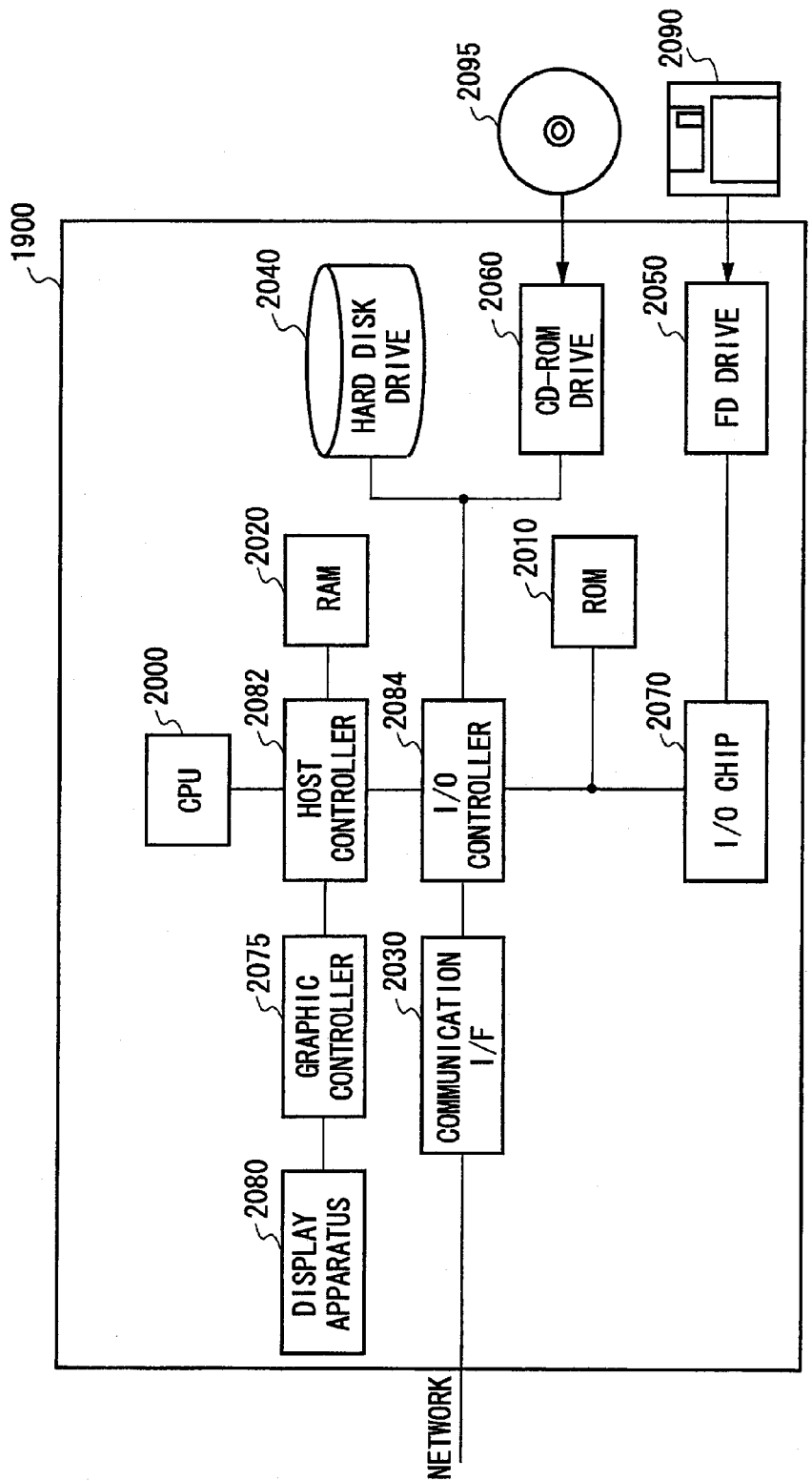
FIG. 4 shows an example of a hardware configuration of a computer 1900 according to the present embodiment.

FIG. 4 shows an example of a hardware configuration of a computer 1900 according to the present embodiment. The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as a control apparatus of the spectrum analysis system 10 are provided with an output module and a setting value input module. Furthermore, the above programs may be provided with a frequency component converting module. These programs and modules prompt the CPU 2000 or the like to make the computer 1900 function as the output section 36, the setting value input section 38, and the frequency component converting section 32.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A spectrum analysis system that measures a signal component at each frequency of an input signal, comprising:
    a sampling section that samples the input signal at prescribed bandwidths to digitize the input signal, and outputs a resulting digital output signal;
    an averaging section that averages the digital sampling section;
    a converting section that converts the digital output signal from the sampling section into the signal component at each frequency of a unit bandwidth; and
    an output section that (i) outputs the digital output signal averaged by the averaging section when a frequency span, which is a frequency range in which the measurement result of the signal component at each frequency of the input signal is output, is greater than or equal to a predetermined reference bandwidth and (ii) outputs the signal component at each frequency converted by the converting section when the frequency span is less than the predetermined reference bandwidth.

2. The spectrum analysis system according to claim 1, wherein
    when the frequency span is less than the predetermined reference bandwidth, the converting section converts the digital output signal output by the sampling section into the signal component at each frequency of a unit bandwidth narrower than the predetermined reference bandwidth.

3. The spectrum analysis system according to claim 2, further comprising:
    a local signal generating section that generates a local signal having a frequency that sequentially changes;
    a multiplying section that outputs a combined signal obtained by multiplying the input signal by the local signal; and
    a band pass filter that passes a prescribed frequency band of the combined signal, wherein
    the sampling section samples the signal passed by the band pass filter to digitize the signal and output a digital output signal.

4. The spectrum analysis system according to claim 3, wherein
    the output section (i) outputs the digital output signal averaged by the sampling section as the signal component, which is a component of the input signal, having a frequency determined according to a frequency of the local signal, when the frequency span is greater than or equal to the reference bandwidth and (ii) outputs the signal component at each frequency converted by the converting section, as the signal component at each frequency within the band determined according to the frequency of the local signal, when the frequency span is less than the reference bandwidth.

5. The spectrum analysis system according to claim 4, wherein the converting section converts the digital output signal output by the sampling section into the signal component at each frequency of a unit bandwidth narrower than the predetermined reference bandwidth by performing a Fast Fourier Transform on the digital output signal.

6. The spectrum analysis system according to claim 4, wherein the reference bandwidth is substantially equal to a pass bandwidth of the band pass filter.

7. The spectrum analysis system according to claim 4, wherein and the output section outputs the digital output signal averaged by the averaging section, as the signal component having the frequency determined according to the frequency of the local signal, when the frequency span is greater than or equal to the reference bandwidth.

8. The spectrum analysis system according to claim 4, wherein the sampling section sets a sampling period of the combined signal when the frequency span is less than the reference bandwidth to be longer than the sampling period of the combined signal when the frequency span is greater than or equal to the reference bandwidth.

9. A spectrum analysis method for measuring a signal component at each frequency of an input signal, comprising:

sampling the input signal at prescribed bandwidths to digitize the input signal, and outputting a resulting digital output signal;

averaging the digital output signal resulting from the sampling;

converting the digital output signal into the signal component at each frequency of a unit bandwidth narrower than the reference bandwidth;

outputting (i) the averaged digital output signal when a frequency span, which is a frequency range in which the measurement result of the signal component at each frequency of the input signal is output, is greater than or equal to the reference bandwidth and (ii) the signal component at each frequency converted during the converting when the frequency span is less than the predetermined reference bandwidth.

10. The spectrum analysis method according to claim 9, wherein the converting involves converting the digital output signal resulting from the sampling into the signal component at each frequency of a unit bandwidth narrower than a predetermined reference bandwidth, when the frequency span is less than the predetermined reference bandwidth.

11. The spectrum analysis method according to claim 10, further comprising:

generating a local signal having a frequency that sequentially changes;

outputting a combined signal obtained by multiplying the input signal by the local signal; and passing a prescribed frequency band of the combined signal, wherein the sampling involves sampling the passed signal to digitize the signal and output a digital output signal.

12. The spectrum analysis method according to claim 11, wherein the outputting involves (i) outputting the averaged digital output signal resulting, as the signal component, which is a component of the input signal, having the frequency determined according to the frequency of the local signal, when the frequency span is greater than or equal to the reference bandwidth and (ii) outputting the signal component at each frequency resulting from the converting, as the signal component at each frequency within the bandwidth determined according to the frequency of the local signal, when the frequency span is less than the reference bandwidth.

* * * * *